United States Patent [19]

Oiwa et al.

[11] Patent Number: 5,868,884
[45] Date of Patent: Feb. 9, 1999

[54] METHOD FOR PRODUCING CERAMIC DIELECTRICS

[75] Inventors: Seigo Oiwa; Toshio Nozaki, both of Nagoya; Toshihiko Kubo, Sanda; Masaya Hashimoto, Sakai, all of Japan

[73] Assignees: Sumitomo Metal Industries, Ltd., Osaka; Sumitomo Metal Electronics Devices, Inc., Yamaguchi, both of Japan

[21] Appl. No.: 713,717

[22] Filed: Sep. 13, 1996

Related U.S. Application Data

[63] Continuation-in-part of Ser. No. 410,491, Mar. 24, 1995, abandoned.

[30] Foreign Application Priority Data

Mar. 25, 1994 [JP] Japan ......................... 6-55618

[51] Int. Cl.$^6$ ..................................... B32B 31/26
[52] U.S. Cl. ..................... 156/89.16; 156/264; 264/614; 264/615; 264/619; 264/674
[58] Field of Search .............. 156/89, 256, 264, 156/277, 89.12, 89.16; 264/5, 6, 56, 60, 61, 65, 615, 619, 670, 674, 676, 681, 614

[56] References Cited

U.S. PATENT DOCUMENTS

| | | |
|---|---|---|
| 3,760,244 | 9/1973 | McClelland, Jr. . |
| 3,908,184 | 9/1975 | Anazawa et al. ......................... 357/72 |
| 4,084,979 | 4/1978 | Sano et al. . |
| 4,318,995 | 3/1982 | Rhodes et al. . |
| 4,575,440 | 3/1986 | Palilla ....................................... 264/61 |
| 4,628,404 | 12/1986 | Yokoe et al. . |
| 4,816,323 | 3/1989 | Inoue . |
| 4,820,562 | 4/1989 | Tanaka et al. ......................... 428/34.6 |
| 4,833,108 | 5/1989 | Mizuno et al. . |
| 5,099,388 | 3/1992 | Ogawa et al. . |
| 5,411,563 | 5/1995 | Yeh et al. ............................. 156/89 X |
| 5,468,694 | 11/1995 | Taguchi et al. ......................... 501/77 |
| 5,565,391 | 10/1996 | Nakano et al. ......................... 501/135 |

FOREIGN PATENT DOCUMENTS

| | | |
|---|---|---|
| 57-50460 | 3/1982 | Japan . |
| 58-111396 | 7/1983 | Japan . |
| 63-166703 | 7/1988 | Japan . |

*Primary Examiner*—Curtis Mayes
*Attorney, Agent, or Firm*—Armstrong, Westerman, Hattori, McLeland & Naughton

[57] ABSTRACT

A method for producing ceramic dielectrics containing a water soluble metal acid or salt includes making a mixture by kneading a water soluble metal acid or salt, particulates, sintering auxiliaries and water, mixing the mixture with a binder and plasticizer to form a slurry, and forming a sheet from the slurry by drying and sintering.

10 Claims, 1 Drawing Sheet

METHOD FOR PRODUCING CERAMIC DIELECTRICS

This application is a continuation-in-part of application Ser. No. 08/410,491, filed Mar. 24, 1995, now abandoned.

BACKGROUND OF THE INVENTION

1. Field of the Invention

The present invention relates to a method for producing ceramic dielectrics and, more particularly, a method for producing ceramic dielectrics for capacitors or substrates.

2. Description of the Related Art

Recently, as a processing speed of electric equipments becomes faster, the clock frequency or the electric signals of such electric equipments has become more rapid. Therefore, ceramic substrates or ceramic packages applied for such electric equipments have been required to adequately function with such clock frequency or such electric signals. In order to adequately function with such clock frequency or such electric signals, ceramic substrates or ceramic packages need a decoupling capacitor that eliminates switching noise and so on.

A conventional method to provide a decoupling capacitor is to mount the capacitor on a ceramic substrate or a ceramic package. In such method, the ceramic substrate or the ceramic package must provide leads between an electric circuit inside and pads that contact electrodes of the capacitor. It has an advantage that any material or any structure of the capacitor is available. On the other hand, it has a disadvantage that such ceramic substrate or such ceramic package must have a space on it in order to mount the capacitor and further provide complicated leads between the electric circuit inside and pads that contact electrodes of the capacitor.

Another conventional method to provide a decoupling capacitor is to form the capacitor inside the ceramic substrate or ceramic package. The method comprises steps of inserting a material of the capacitor and a conductive paste pattern for electrical connection between green sheets before sintering. This method has great advantages of simplifying the producing process and there is no requirement to have a space on the ceramic substrate or the ceramic package, so that the manufacturing cost can be lower and downsizing can easily be achieved.

As to a basic material for the ceramic capacitor, $TiO_2$, $CaTiO_3$, $SrTiO_3$ are well-known. In recent years, $MgTiO_3$—$CaTiO_3$, $Ba(Zn,Nb)O_3$—$Ba(Zn,Ta)O_3$, $BaO$—$PbO$—$Nb_2O_3$—$TiO_2$, and $BaO$—$Sm_2O_3$—$5TiO_2$, having stable property within a wide temperature range, have been known.

As to a conductive paste for an alumina ceramic substrate or alumina ceramic package, a mixture of metal powder such as tungsten or molybdenum and alumina particulates has been used.

A multilayer alumina ceramic has been produced by co-firing the conductive paste and alumina ceramic materials at 1500° C.–1650° C. in a reducing atmosphere. The reducing atmosphere has been applied in order to avoid metal oxidation of conductive paste. However, the reducing atmosphere reacts with the above-mentioned material for the ceramic capacitor, so that such material has changed from insulator to semiconductor. As a result, such changed material leads to an electric short inside the capacitor or change of dielectric property.

On the other hand, it has been known that it is possible to improve the dielectric constant by dispersing a metal powder in a ceramic dielectric. By applying the method to ceramic dielectrics for capacitors or substrates, a capacitor with the dispersed metal powder has been proposed.

The U.S. Pat. No. 5,099,388, which corresponds to Japanese Patent Laid-Open No.91-87091, discloses an alumina multilayer ceramic substrate having a dielectric layer comprising alumina as a base material and 5–50 wt % of one or more elements selected from molybdenum (Mo) and tungsten (W). FIG. 1 is a diagrammatic sectional view of the alumina multilayer substrate shown in the above Japanese Patent, wherein the numeral 12 represents a high dielectric material layer. Inside the alumina multilayer substrate, a high dielectric material layer 12 is formed with a dispersed metal powder such as Mo and metallized layers 13a, 13b are formed on both sides of said high dielectric material layer 12. Said high dielectric material layer 12 and said metallized layers 13a, 13b compose a capacitor. Further, alumina layers 11a, 11b are formed on both sides of said metallized layers 13a, 13b. Said metallized layers 13a, 13b are connected to conductive layers 15a, 15b by conductors 14a, 14b. The above-mentioned structure functions as a decoupling capacitor when electronic devices and the like are mounted, that makes it possible to effectively eliminate electric noise.

Next, a method for manufacturing said capacitor layer is described below. A green sheet for capacitors is formed by the following steps: (a) making a mixture by kneading alumina particulates and one or more elements selected from molybdenum powder, molybdenum trioxide powder, tungsten powder, and tungsten trioxide powder as sintering auxiliaries; (b) forming a predetermined shape from said mixture; (c) sintering said formed mixture in a reductive atmosphere.

In the above-mentioned alumina multilayer ceramic substrate, the relative dielectric constant of the capacitor layer, that is to say, a capacitance of the capacitor layer, is not high enough to function as a decoupling capacitor. In order that the capacitance of the capacitor layer becomes high, it is necessary that said capacitor contains a large amount of metal. Such capacitor, however, easily causes dielectric breakdown.

SUMMARY OF THE INVENTION

The present invention was achieved in order to solve these problems, and it is an object to provide a method for producing ceramic dielectrics, having a higher dielectric constant but no electric short.

The method for producing ceramic dielectrics disclosed in the present invention comprises the steps of:

(a) making a mixture by kneading a water soluble metal acid or salt, particulates, sintering auxiliaries and water;

(b) drying said mixture;

(c) making a slurry by mixing said mixture with a binder and a plasticizer;

(d) forming a sheet from said slurry;

(e) drying said sheet; and (f) sintering said dried sheet in a non-oxidative atmosphere.

The above-mentioned method allows ceramic dielectrics having a higher relative dielectric constant, especially 20 or more, to be easily produced, which is used for capacitors or substrates.

Another method for producing ceramic dielectrics disclosed in the present invention comprises the steps of:

(a) making a mixture by kneading a water soluble metal acid or salt, particulates, sintering auxiliaries and water;

(b) drying said mixture;

(c) making a slurry by mixing said mixture with a binder and a plasticizer;

(d) forming a sheet from said slurry;

(e) drying said sheet;

(f) cutting said dried sheet;

(g) printing conductive paste on said cut sheet;

(h) laminating said printed sheet; and (i) sintering said laminated sheet in a non-oxidative atmosphere.

The above-mentioned method allows ceramic dielectrics having a higher relative dielectric constant, especially 20 or more, to be easily produced, which is used for a substrate.

The main advantage of the present invention is that the water soluble metal acid or salt is uniformly dispersed very well, so that the ceramic dielectrics produced thereby have a higher relative dielectric constant, in particular 20 or more, without electric short. Especially such relative dielectric constant is much higher than the conventional ones because such ceramic dielectrics can contain a large amount of metal using the method disclosed in the present invention.

DETAILED DESCRIPTION OF THE INVENTION

Figure 1:
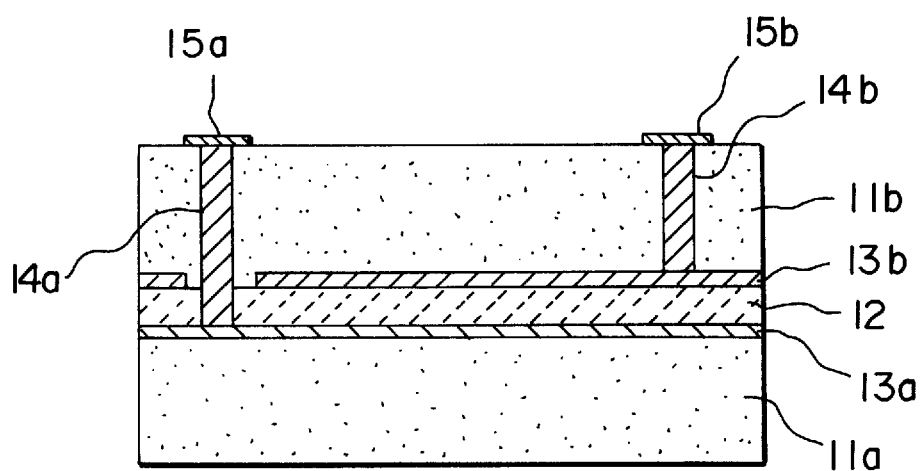
FIG. 1 is a diagrammatic sectional view showing a composition of an alumina multilayer substrate in the U.S. Pat. No. 5,099,388.

A method of this invention is described in detail below.

A liquid mixture is made by kneading a water soluble metal acid or salt, particulates, and said sintering auxiliaries with water. During kneading, a water soluble metal acid or salt is uniformly dissolved and dispersed in water using its soluble property and hydrophilic property. Said mixture is dried, and then a slurry is made by mixing said dried mixture with a binder and a plasticizer. Then a sheet is formed from said slurry by doctor-blading or pressing. And then the formed sheet is dried by a furnace. Finally said dried formed sheet is sintered by another furnace in a non-oxidative atmosphere.

As said ceramic particulate for a base material of ceramic dielectrics, alumina, aluminum nitride and zirconium oxide are exemplified. Such ceramic particulates can be sintered at a temperature between approximately 1400° C.–1800° C.

As said water soluble metal acid, molybdic acid ($H_2MoO_4$, $H_2MoO_4 \cdot H_2O$), and tungstic acid ($H_2WO_4$, $H_2WO_4 \cdot H_2O$) are preferable. Molybdic salt and tungstic salt may also be used. As said water soluble metal salt, ammonium molybdate (($NH_4)_6[Mo_7O_{24}] \cdot 4H_2O$, $3(NH_4)_2 \cdot 7MoO_2 \cdot 4H_2O$), and ammonium tungstate (($NH_4)_{10}H_{10}[W_{12}O_{46}] \cdot 6H_2O$, $5(NH_4)_2 12WO_3 \cdot 11H_2O$) are preferable.

The ceramic dielectrics produced by the above-mentioned method have an excellent dispersibility of a metal fine powder, that is to say, the ceramic dielectrics can contain a large amount of metal. The excellent dispersibility of a metal fine powder herein leads to no electric short inside the ceramic dielectrics. Especially, the ceramic dielectrics comprising alumina as a base material and dispersed molybdenum has a relative dielectric constant, especially 20 or more, that is much higher than all expectations.

DESCRIPTION OF PREFERRED EMBODIMENTS

Example of a method for producing ceramic dielectrics according to the present invention is described below.

Alumina particulates having a mean diameter of 1 μm, a molybdic acid ($H_2MoO_4 \cdot H_2O$) powder, sintering auxiliaries and distilled water were weighed in the proportions shown in Table 1.

TABLE 1

| | |
|---|---|
| Alumina particulates | 35.5 (wt %) |
| Molybdic acid powder | 4.5 (wt %) |
| Sintering auxiliaries | 10 (wt %) |
| Distilled water | 50 (wt %) |

Next, a molybdic acid powder was dissolved in the distilled water. Then, alumina particulates and sintering auxiliaries were put therein and kneaded using a ball mill for 24 hours. And then the kneaded mixture was dried and made a lump of the mixture. After that, the lump was crushed into a powder. And then, butyral resin as a binder, dibutyl phthalate (DBP) as a plasticizer and xylene as a solvent were added to the crushed mixture and then mixed using a ball mill for 24 hours in order to make a slurry. Next, the slurry was formed into sheets of tape by the doctor-blade method. After sufficiently drying the sheets of tape at 150° C., the said sheets are cut into a predetermined size. Then a conductive paste comprising tungsten was screen-printed on both sides of the cut sheet. Lastly the screen-printed sheet was cut into a capacitor size and sintered at 1550° C. in a nitrogen atmosphere containing hydrogen of 10 vol % for one hour to turn into ceramic capacitors.

In order to measure the dielectric constants and the resistance to calculate the electric short rate, fifty samples per lot were manufactured under the same condition. The dielectric constants and the electric short rate of each lot are shown in Table 2. All samples have no electric short and very high relative dielectric constant.

TABLE 2

| | Lot number | | | | | | | |
|---|---|---|---|---|---|---|---|---|
| Material | 1 | 2 | 3 | 4 | 5 | 6 | 7 | 8 |
| $Al_2O_3$ Particulate (wt %) | 42 | 40 | 38 | 35.5 | 33 | 31 | 29 | 27 |
| Sintering auxiliaries (wt %) | 5.5 | 5 | 4.5 | 4.5 | 4.5 | 4 | 3.5 | 3 |
| $H_2MoO_4 \cdot H_2O$ (wt %) | 2.5 | 5 | 7.5 | 10 | 12.5 | 15 | 17.5 | 20 |
| Distilled water (wt %) | 50 | 50 | 50 | 50 | 50 | 50 | 50 | 50 |
| Relative Dielectric Constant | 10.5 | 12.7 | 14.9 | 17.3 | 20.5 | 24.7 | 28.5 | 32.0 |
| Electric short rate (%) | 0 | 0 | 0 | 0 | 0 | 0 | 0 | 0 |

On the other hand, ceramic capacitors were produced by the below-described method as comparative samples.

Alumina particulates, a molybdenum powder, sintering auxiliaries and distilled water were weighed in the proportions shown in Table 3.

TABLE 3

| | |
|---|---|
| Alumina particulates | 40.5 (wt %) |
| Molybdenum powder | 5 (wt %) |
| Sintering auxiliaries | 4.5 (wt %) |
| Distilled water | 50 (wt %) |

Then, alumina particulates, a molybdenum powder, sintering auxiliaries and a distilled water were put therein and kneaded using a ball mill for 24 hours. And then the kneaded mixture was dried and made a lump of the mixture. After that, the lump was crushed into a powder. And then, butyral resin as a binder, dibutyl phthalate (DBP) as a plasticizer and xylene as a solvent were added to the crushed mixture and then mixed using a ball mill for 24 hours in order to make a slurry. Next, the slurry was formed into sheets of tape by the doctor-blade method. After sufficiently drying the sheets of tape at 150° C., the said sheets are cut into a predetermined size. Then a conductive paste comprising tungsten was screen-printed on both sides of the cut sheet. Lastly the screen-printed sheet was cut into a capacitor size and sintered at 1550° C. in a nitrogen atmosphere containing hydrogen of 10 vol % for one hour to turn into ceramic capacitors.

In order to measure the dielectric constants and the resistance to calculate the electric short rate, fifty samples per lot were manufactured under the same condition. The dielectric constants and the electric short rate of each lot are shown in Table 4.

TABLE 4

| Material | Lot number | | | | | | | | | |
|---|---|---|---|---|---|---|---|---|---|---|
| | 9 | 10 | 11 | 12 | 13 | 14 | 15 | 16 | 17 | 18 |
| $Al_2O_3$ Particulate (wt %) | 45 | 43 | 40.5 | 38 | 36 | 34 | 32 | 29 | 27 | 22.5 |
| Sintering auxiliaries (wt %) | 5 | 4.5 | 4.5 | 4.5 | 4 | 4 | 3 | 3.5 | 3 | 2.5 |
| Mo (wt %) | 0 | 2.5 | 5 | 7.5 | 10 | 12.5 | 15 | 17.5 | 20 | 25 |
| Distilled water (wt %) | 50 | 50 | 50 | 50 | 50 | 50 | 50 | 50 | 50 | 50 |
| Relative Dielectric Constant | 5 | 9.1 | 11.0 | 14.6 | 18.2 | 24.0 | — | — | — | — |
| Electric short rate (%) | 0 | 0 | 0 | 0 | 30 | 50 | 70 | 100 | 100 | 100 |

Having described preferred embodiments of the invention, it is to be understood that the invention is not limited to the precise embodiments and that various changes and modifications may be affected therein by one skilled in the art without departing from the scope or spirit of the present invention which is defined by the appended claims.

What is claimed is:

1. A method for producing ceramic dielectrics comprising the steps of:
   (a) making a mixture by kneading a water soluble metal acid or salt, ceramic particulates, sintering auxiliaries and water;
   (b) drying said mixture;
   (c) making a slurry by mixing said mixture with a binder and a plasticizer;
   (d) forming a sheet from said slurry;
   (e) drying said sheet; and
   (f) sintering said dried sheet in a non-oxidative atmosphere,
   wherein the produced ceramic dielectrics have a relative dielectic constant of 20 or more.

2. The method for producing ceramic dielectrics according to claim 1, wherein the water soluble metal acid is molybdic acid.

3. The method for producing ceramic dielectrics according to claim 1, wherein the water soluble metal salt is molybdic salt.

4. The method for producing ceramic dielectrics according to claim 1, wherein the water soluble metal acid is tungstic acid.

5. The method for producing ceramic dielectrics according to claim 1, wherein the water soluble metal salt is tungstic salt.

6. A method for producing ceramic dielectrics comprising the steps of:
   (a) making a mixture by kneading a water soluble metal acid or salt, ceramic particulates, sintering auxiliaries and water;
   (b) drying said mixture;
   (c) making a slurry by mixing said mixture with a binder and a plasticizer;
   (d) forming a sheet from said slurry;
   (e) drying said sheet;
   (f) cutting said dried sheet;
   (g) printing conductive paste on one of said cut sheets;
   (h) laminating another cut sheet on said cut and printed sheet; and
   (i) sintering said laminated sheet in a non-oxidative atmosphere, wherein the produced ceramic dielectrics have a relative dielectric constant of 20 or more.

7. The method for producing ceramic dielectrics according to claim 6, wherein the water soluble metal acid is molybdic acid.

8. The method for producing ceramic dielectrics according to claim 6, wherein the water soluble metal salt is molybdic salt.

9. The method for producing ceramic dielectrics according to claim 6, wherein, the water soluble metal acid is tungstic acid.

10. The method for producing ceramic dielectrics according to claim 6, wherein, the water soluble metal salt is tungstic salt.

* * * * *